(12) United States Patent
Kim et al.

(10) Patent No.: US 12,543,539 B2
(45) Date of Patent: *Feb. 3, 2026

(54) SUBSTRATE HANDLING DEVICE WITH ADJUSTABLE JOINTS

(71) Applicant: ASM IP Holding B.V., Almere (NL)

(72) Inventors: KiHyun Kim, Chandler, AZ (US); Sam Kim, Chandler, AZ (US); Rutvij Naik, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/509,543

(22) Filed: Nov. 15, 2023

(65) Prior Publication Data

US 2024/0096685 A1 Mar. 21, 2024

Related U.S. Application Data

(63) Continuation of application No. 17/961,882, filed on Oct. 7, 2022, now Pat. No. 11,837,494, which is a continuation of application No. 17/189,787, filed on Mar. 2, 2021, now Pat. No. 11,488,854.

(60) Provisional application No. 62/988,217, filed on Mar. 11, 2020.

(51) Int. Cl.
*H01L 21/687* (2006.01)
*B65G 47/90* (2006.01)
*H01L 21/677* (2006.01)

(52) U.S. Cl.
CPC ........ *H01L 21/68707* (2013.01); *B65G 47/90* (2013.01)

(58) Field of Classification Search
CPC .......... H01L 21/68707; H01L 21/67742; B25J 9/042; B25J 9/043
See application file for complete search history.

(56) References Cited

U.S. PATENT DOCUMENTS

| | | | |
|---|---|---|---|
| 2,060,210 A | 11/1936 | Winfield | |
| 5,151,008 A * | 9/1992 | Ishida | B25J 9/0084 414/744.5 |
| 5,431,529 A | 7/1995 | Eastman | |
| 5,746,565 A * | 5/1998 | Tepolt | H01L 21/68707 414/935 |
| 5,976,258 A | 11/1999 | Kleiner | |
| 6,805,466 B1 | 10/2004 | Ranish | |
| 7,601,272 B2 | 10/2009 | Nguyen et al. | |

(Continued)

FOREIGN PATENT DOCUMENTS

| | | |
|---|---|---|
| JP | 2006110662 A | 4/2006 |
| JP | H09213768 A | 7/2006 |
| KR | 20140133534 A | 11/2014 |

*Primary Examiner* — Gerald McClain
(74) *Attorney, Agent, or Firm* — Snell & Wilmer L.L.P.

(57) ABSTRACT

An adjustable joint for insertion into a linkage of a substrate handler utilized for substrate processing. The adjustable joint allows for adjusting the pitch and roll of an attached link. Such adjustment may permit aligning a pickup surface of an end effector to a desired plane. Once adjusted, the joint may be fixed to maintain the desired orientation of the attached link. The adjustable joint allows for correcting deflection of a pickup surface of an end effector relative to a desired pickup plane due to, for example, drooping caused by high temperature usage, mechanical tolerances and/or installation errors.

11 Claims, 8 Drawing Sheets

(56) References Cited

U.S. PATENT DOCUMENTS

| | | | |
|---|---|---|---|
| 8,915,693 B2* | 12/2014 | Shimamoto | B25J 9/08 |
| | | | 414/744.5 |
| 10,090,188 B2 | 10/2018 | Thanu | |
| 11,407,108 B2 | 8/2022 | Inomata | |
| 11,488,854 B2* | 11/2022 | Kim | B65G 47/90 |
| 11,691,268 B2 | 7/2023 | Hosek et al. | |
| 11,837,494 B2* | 12/2023 | Kim | H01L 21/68707 |
| 2003/0202792 A1* | 10/2003 | Goshi | H01L 21/68792 |
| | | | 396/564 |
| 2005/0285419 A1 | 12/2005 | Matsumoto | |
| 2007/0097383 A1* | 5/2007 | Nguyen | G03F 1/80 |
| | | | 257/E21.252 |
| 2008/0226430 A1* | 9/2008 | Minami | H01L 21/67742 |
| | | | 414/217 |
| 2013/0084156 A1 | 4/2013 | Shimamoto | |
| 2014/0007731 A1 | 1/2014 | Hosek | |
| 2015/0225854 A1 | 8/2015 | Madsen | |
| 2017/0368680 A1* | 12/2017 | Muthukamatchi | |
| | | | H01L 21/67184 |

* cited by examiner

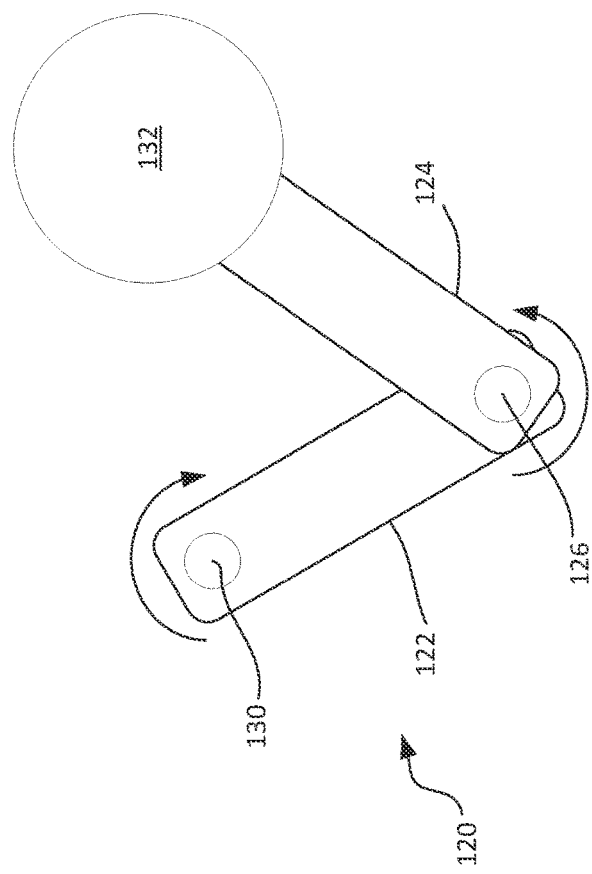
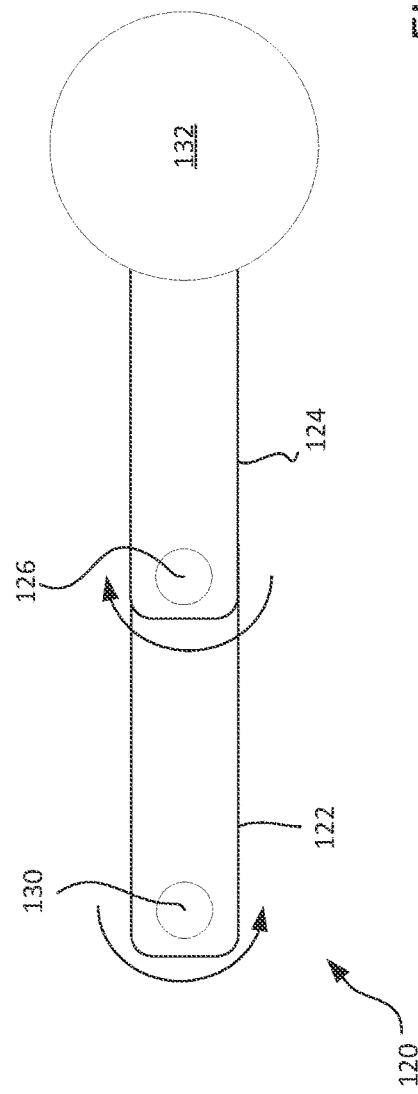

SUBSTRATE HANDLING DEVICE WITH ADJUSTABLE JOINTS

CROSS-REFERENCE TO RELATED APPLICATIONS

This application is a continuation of, and claims priority to and the benefit of, U.S. patent application Ser. No. 17/961,882, filed Oct. 7, 2022 and entitled "SUBSTRATE HANDLING DEVICE WITH ADJUSTABLE JOINTS," which is a continuation of, and claims priority to and the benefit of, U.S. patent application Ser. No. 17/189,787, filed Mar. 2, 2021 and entitled "SUBSTRATE HANDLING DEVICE WITH ADJUSTABLE JOINTS," now U.S. Pat. No. 11,488,854 issued Nov. 1, 2022, which is a non-provisional of, and claims priority to and the benefit of, U.S. Provisional Patent Application No. 62/988,217, filed Mar. 11, 2020 and entitled "SUBSTRATE HANDLING DEVICE WITH ADJUSTABLE JOINTS," all of which are hereby incorporated by reference herein.

FIELD OF THE DISCLOSURE

The present disclosure generally relates to gas-phase reactors and systems. More particularly, the disclosure relates to a system and method for substrate handling during substrate processing, and specifically to a substrate transfer linkage with adjustable joints for high temperature applications.

BACKGROUND OF THE DISCLOSURE

Gas-phase reactors, such as chemical vapor deposition (CVD), plasma-enhanced CVD (PECVD), and atomic layer deposition (ALD) reactors can be used for a variety of applications, including depositing and etching materials on a substrate surface (e.g., semiconductor wafer). For example, gas-phase reactors can be used to deposit and/or etch layers on a substrate to form semiconductor devices, flat panel display devices, photovoltaic devices, microelectromechanical systems (MEMS), and the like.

A typical gas-phase reactor system includes a reactor including a reaction chamber, one or more precursor and/or reactant gas sources fluidly coupled to the reaction chamber, one or more carrier and/or purge gas sources fluidly coupled to the reaction chamber, a gas injection system to deliver gases (e.g., precursor/reactant gas(es) and/or carrier/purge gas(es)) to the reaction chamber, and an exhaust source fluidly coupled to the reaction chamber. During processing, one or more substrates are placed within the reaction chamber using a substrate transfer device (e.g., linkage or robotic arm). Once placed in the reaction chamber, the substrate(s) may be exposed to various precursors and/or reactant gases. After processing, the substrate(s) are removed from the reaction chamber using the transfer device. During such processing, care must be taken to avoid physical damage and particulate contamination to the substrates, which are extremely brittle and easily contaminated.

Various systems are known for handling substrates within gas-phase processing systems. The particular application or environment from which the substrates is lifted often determines the type of pickup device (e.g., 'end effector'). One class of pickup devices, known as Bernoulli wands are typically used for high temperature applications. Bernoulli wands utilize jets of gas downward from the wand toward the substrates to create a region of low pressure above the wafer, thereby lifting the substrates. The advantage being that the substrates need not physically contact the pickup wand. Such a Bernoulli wand is shown in U.S. Pat. No. 5,080,549 to Goodwin et al. Another type of wafer pickup device is a simple paddle which relies on friction due to gravity between substrate support surfaces and the back of the substrates. In a variation, the paddle is augmented with a vacuum to hold the substrates on the paddle.

Although such mechanisms work relatively well to place substrates within and remove substrates from a reactor, moving parts of such mechanisms can provide a source of particulate contaminates. In addition, as reaction temperatures within the reactor continue to increase, links of the substrate transfer device that support a pickup device (e.g., end effector) are susceptible to slight deflection (e.g., drooping) that can result in deviations in substrate position during transfer. Such deviations can result in substrate damage. Accordingly, improved mechanisms and techniques for transferring substrates are desired.

Any discussion, including discussion of problems and solutions, set forth in this section has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to necessarily identify key features or essential features of the claimed subject matter, nor is it intended to be used to limit the scope of the claimed subject matter.

Various embodiments of the present disclosure are directed to an adjustable joint for insertion into a linkage of a substrate handler utilized for substrate processing. The adjustable joint allows for adjusting the pitch and roll of one of the links attached to the adjustable joint. Such adjustment may permit aligning a pickup surface of an end effector to a desired plane. Once adjusted, the joint may be fixed to maintain the desired orientation of the attached link. The adjustable joint allows for correcting deflection of a pickup surface of an end effector relative to a desired pickup plane due to, for example, drooping caused by high temperature usage, mechanical tolerances and/or installation errors.

In an arrangement, an adjustable linkage type substrate handling device is disclosed. The device includes at least first and second links that each extend between a proximal end and a distal end. Such links are typically elongated having a long axis extending between their proximal and distal ends. Adjacent links are attached by a rotary joint about which the links may rotate. In an arrangement, a distal end of the first link attaches to a proximal end of the second link via the rotary joint. The distal end of the linkage (e.g., second link or subsequent link) may support an end effector. To provide adjustment for one of the links, an adjustable joint may be disposed between an end of one of the links and the rotary joint. The adjustable joint includes a first body connectable to the rotary joint and a second body connectable to one of the links, such as the proximal end of the second link. The bodies of the adjustable joint are connectable at a selected contact angle to adjust a pitch and/or roll of the link connected to the second body. Such adjustment may provide desired alignment for the end effector. Once a contact angle is selected, the bodies may be fixedly connected to maintain this orientation.

In an arrangement, the first and second bodies of the adjustable joint include mating surfaces. The first body may include an adjustment surface and the second body may include a contact surface. The adjustment surface abuts the contact surface when the bodies are rigidly connected. One or more adjustors (e.g., set screws) may be selectively extended through the adjustment surface. When extending above the adjustment surface, the adjustor(s) provide a spacing between the adjustment surface and the contact surface when the first and second bodies are fixedly attached. That is, the contact angle between the first and second body may be adjusted based on the position of the adjustors relative to the adjustment surface. Such adjustment may be in first and/or second axes.

In another arrangement, a linkage type substrate handling device that reduces the potential of substrate contamination is disclosed. The device includes at least first and second links connected by a rotary coupling having at least a first gear that translates rotary motion from the first link to the second link. In an arrangement, a distal end of the first link attaches to a proximal end of the second link via the rotary coupling. A distal end of the device supports an end effector configured to engage and release substrates (e.g., semiconductor wafers). The end effector is spaced a distance from all gearing of the substrate handling device to reduce a potential source of particulate contamination. In an arrangement, an edge (e.g., proximal edge) of the end effector is at least 100 mm from any gearing in the substrate handler. In another arrangement, the end effector is at least 200 mm from any gearing in the substrate handler.

These and other embodiments will become readily apparent to those skilled in the art from the following detailed description of certain embodiments having reference to the attached figures; the disclosure not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIGS. 2A and 2B illustrate a substrate handling device in retracted and extended positions, respectively.

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure.

DETAILED DESCRIPTION OF EXEMPLARY EMBODIMENTS OF THE DISCLOSURE

The description of exemplary embodiments provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

As used herein, a substrate can refer to any material having a surface onto which material can be deposited. A substrate can include a bulk material such as silicon (e.g., single crystal silicon) or may include one or more layers overlying the bulk material. Further, the substrate may include various topologies formed within or on at least a portion of a layer of the substrate.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

Figure 1:
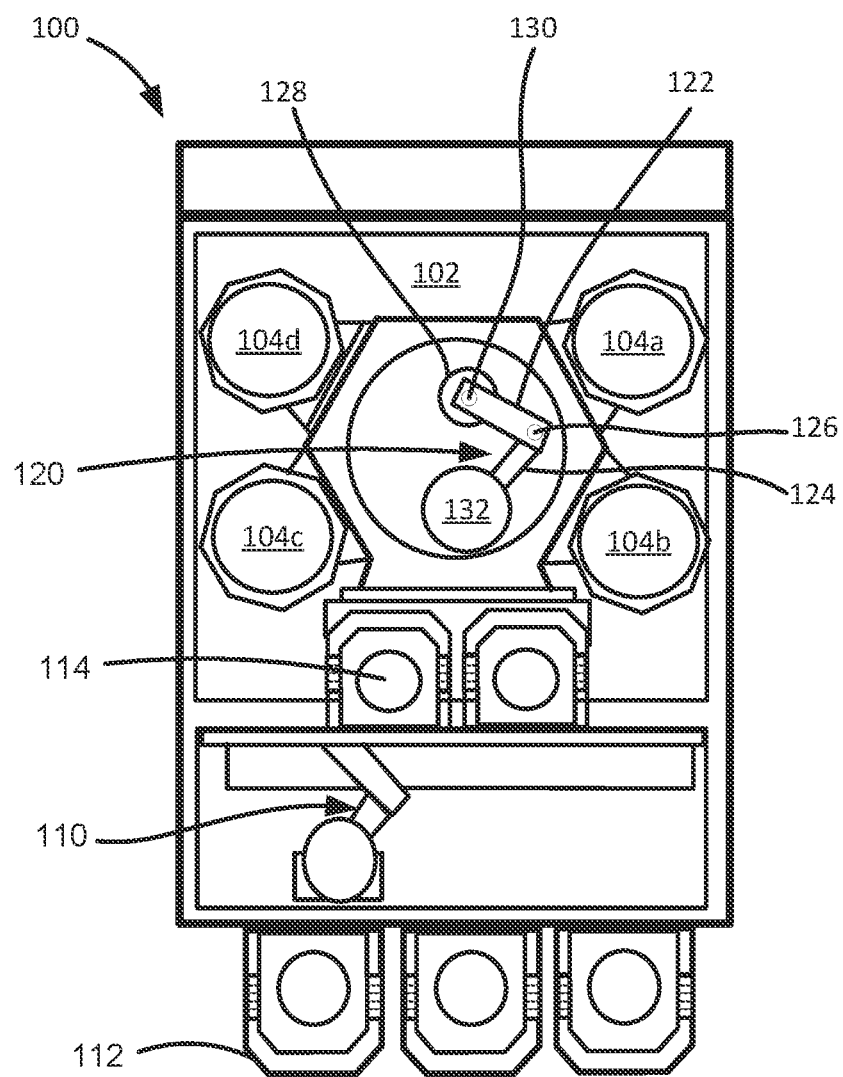
FIG. 1 illustrates a reactor system.

Turning now to the figures, FIG. 1 illustrates an exemplary reactor system 100. Reactor system 100 can be used for a variety of applications, such as, for example, chemical vapor deposition (CVD), plasma-enhanced CVD (PECVD), atomic layer deposition (ALD), clean processes, etch processes, and the like. In an exemplary embodiment, the system is an epitaxial reactor system, however, unless otherwise noted, embodiments and the disclosure are not so limited.

In the illustrated example, reactor system 100 includes a reactor 102 having four separate reaction chambers 104a-d. In this embodiment, a first substrate handler 110 (e.g., linkage or robotic arm) is used to move substrates (e.g., semiconductor wafers) from one or more cassettes 112 to an intermediate loading station 114. The cassettes 112 (e.g., Front Opening Unified Pod's FOUP) may each hold multiple substrates and engage with loading stations for loading cassettes into the system 100. Subsequently, a second substrate handler 120 is used to move the substrates from the intermediate loading station 114 to the reaction chambers 104a-d. In the system of FIG. 1, four substrates can be processed simultaneously. However, it will be appreciated that the system may be configured to process more substrates or fewer substrates (e.g., a single substrate). The system 100 may further include a gas injection and purge system (not shown) fluidly coupled to the processing stations as well as a heating system (not shown) to elevate temperatures within the reaction chamber 102 and/or the processing stations to a desired processing temperature. In an embodiment, the heating system may be constructed and arranged to maintain temperatures between 20 and 2000° C. Further, the system may include a pressure system (not shown) constructed and arranged to reach and/or maintain a pressure in the reaction chamber and/or the processing stations between 0.001 and 700 Torr. Further, the system 100 may include a controller (not shown) configured to control the operation of the system.

In the illustrated embodiment, the substrate handler 120 disposed within the reaction chamber 102 is a controllable arm having first and second links 122, 124 that are connected via a first rotary joint or coupling 126 about which the links may rotate. More specifically, a distal end of the first link 122 connects to a proximal end of the second link 124. A proximal end of the first link 122 is coupled to a base member 128 via a second rotary joint or coupling 130. A free or distal end of the second link 124 supports a substrate pickup device or end effector 132. In one embodiment, the end effector 132 is a Bernoulli wand. Such a Bernoulli wand utilize jets of gas exiting downward from the wand toward an underlying substrate to create a region of low pressure above the substrate, thereby, lifting it. However, it will be appreciated that the present disclosure is not limited to any particular end effector. The rotary couplings 126, 130 permit the substrate handler 120 to extend and retract as illustrated in FIGS. 2A and 2B, respectively. The rotary couplings may have various bearings, shafts, gears and/or actuators that effect the extension and retraction of the substrate handler to a desired position.

Figure 3A:
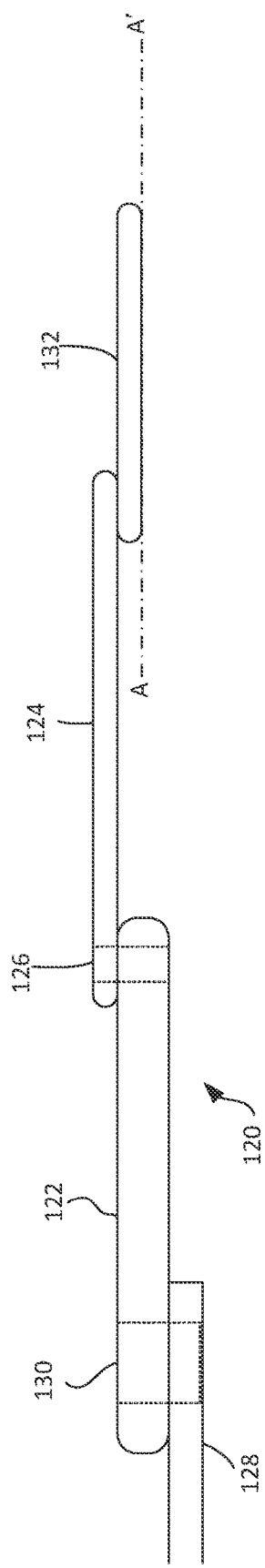
FIGS. 3A-3C illustrate a side view of a link-type substrate handler in non-deflects, deflected and corrected positions, respectively.
Figure 3B:
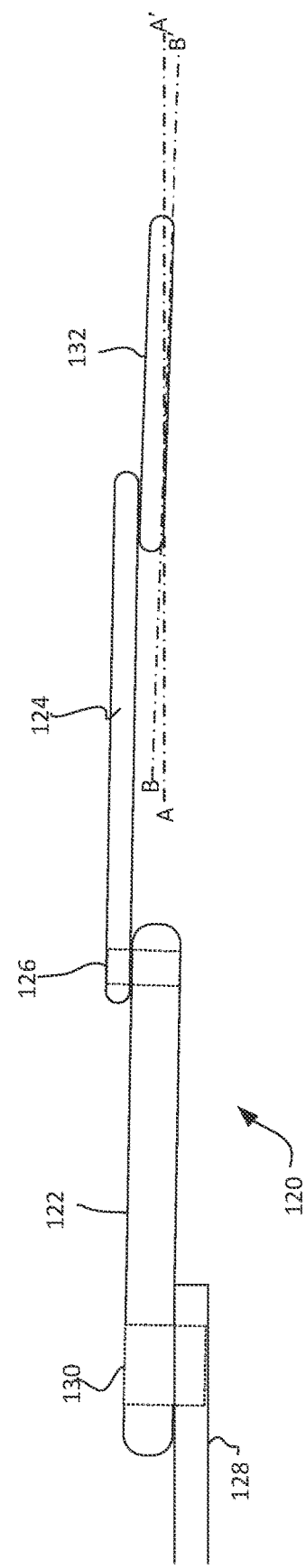

As illustrated in the exemplary embodiment of FIG. 1, one substrate handler 120 is disposed within the reaction chamber 102. Such disposition within the reaction chamber 102 exposes the substrate handler 120 to the elevated temperatures required for substrate processing. By way of example, some epitaxial reactor systems operate continuously at temperatures in excess of 500 or even 700° C. At such elevated temperatures, the substrate handler 120 can experience unwanted deflection or drooping between its base end and its distal end, which supports the end effector. Alternatively, mechanical tolerances and/or installation errors can result in unwanted deflections. This is illustrated in FIGS. 3A and 3B, which show a simplified side view of the substrate handler 120 in an extended position. As shown, the base or proximal end of the first link 122 is coupled to the base member 128 by the second rotary coupling 130. The first and second links 122, 124, connected by the first rotary coupling 126, cantilever from the base member 128 supporting the end effector 132 at the distal end of the second link 124. FIG. 3A illustrates the substrate handler 120 where there is no deflection. In an arrangement where there is no deflection along the length of the substrate handler 120, a pickup surface (e.g., bottom surface) of the end effector 132 is aligned with a desired pickup plane A-A.' That is, a generally planar bottom surface of the end effector 132 is disposed substantially within the reference plane A-A.' Stated otherwise, in the absence of deflection, a vertical position and/or tilt of the end effector is at a desired location permitting precise engagement and placement of substrates.

In arrangements where deflection is present due to high temperatures or other mechanical misalignment, the pickup surface of the end effector 132 may be misaligned with the desired pickup plane A-A.' By way of example, elevated temperatures can result in the distal end of the substrate handler 120 drooping. This is illustrated in FIG. 3B. As shown, in high temperature applications, the rotary couplings between the links may permit some movement between these components. Alternatively or additionally, the cantilevered links themselves may slightly deflect (e.g., under gravity) at such elevated temperatures. This can result in the planar pickup surface B-B' of the end effector 132 being displaced relative to the desired pickup plane A-A.' That is, the generally planar pickup surface of the end effector 132 may be displaced (e.g., vertically and/or tilted) relative to the reference plane A-A.' Such displacement can compromise the precision at which the end effector engages and releases substrates. Stated otherwise, the end effector 132 may be misaligned from its desired location potentially resulting in substrate damage during substrate processing.

To account for such displacement, the present disclosure incorporates an adjustable joint 150 with at least one of the links 122, 124 of the substrate handler 120. The adjustable joint permits adjusting the orientation of one of the links to a desired orientation (e.g., pitch and roll) at which time the adjustable joint may be fixed to maintain that orientation. In an embodiment illustrated in FIG. 3C, the adjustable joint 150 is disposed between and connects the second link 124 to the first link 122. More specifically, a body 152 of the adjustable joint 150 attaches to the first rotary coupling 126 supported by a distal end of the first link 122. That is, a proximal portion of the joint body 152 engages the rotary coupling 126 while a distal portion of the joint body 152 is configured to engage a proximal end 142 of the second link 124. As is more fully discussed below, the joint 150 allows for adjusting the height of a distal end 144 of the second link 124. That is, the joint 150 allows for adjusting the 'pitch' of the second link 124 along its long axis C-C' extending between the proximal end 142 and the distal end 144. Further, the joint 150 allows for adjusting the angular orientation of the second link 124 around its long axis C-C.' Stated otherwise, the joint allows for adjusting the 'roll' of the second link 124. The incorporation of the adjustable joint 150 into the substrate handler 120 permits aligning the generally planar pickup surface of the end effector 132 with the desired pickup plane A-A.'

Figure 3C:
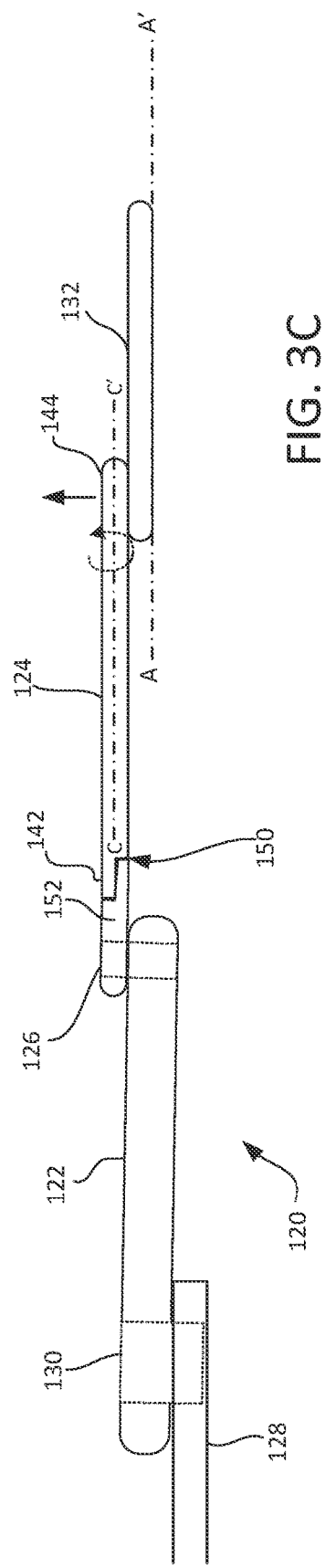

In the embodiment illustrated in FIG. 3C, the adjustable joint 150 adjusts the distal end 144 of the second link 124 upward and, if needed, around the long axis C-C' of the second link 124 to align the pickup surface of the end effector 132 with the desired pickup plane A-A.' That is, FIG. 3C illustrates the substrate handler 120 in a corrected position. Such adjustment allows correcting what may be termed 'negative displacement' where the end effector pickup surface is initially displaced below the desired pickup plane. Notably, the adjustable joint may also allow for correcting 'positive displacement' (not shown) where the end effector pickup surface is displaced above the desired pickup plane. In operation, the amount of positive or negative displacement may be measured and corrected during initial setup of a substrate handler. Alternatively, the positive or negative displacement may be measured and corrected after placing the substrate handler in use.

Figure 4A:
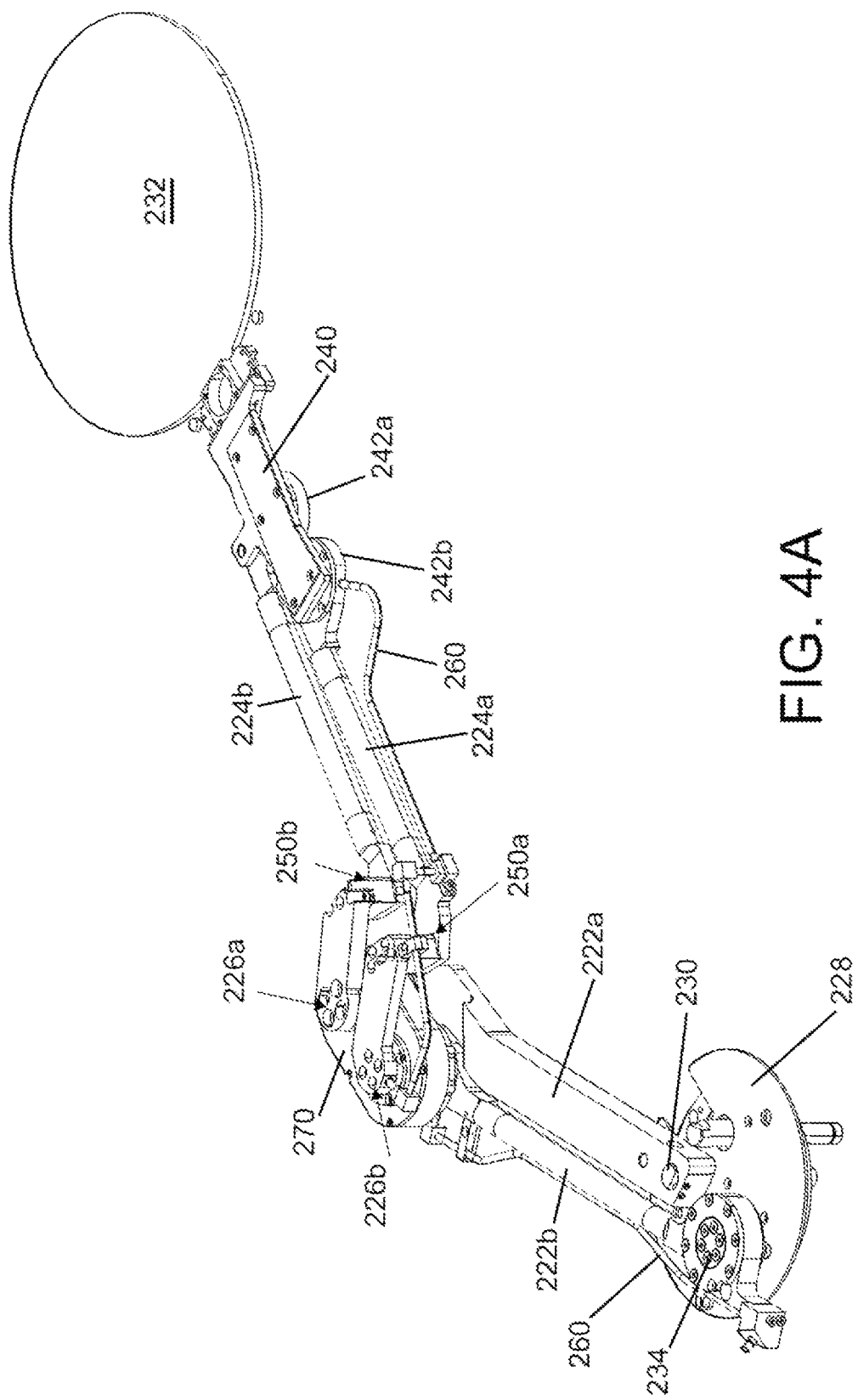
FIG. 4A illustrates an embodiment of a dual arm substrate handler.

FIG. 4A illustrates another embodiment of a linkage-type substrate handler. More specifically, a dual arm substrate handler 220. The substrate handler includes a linkage that includes a first pair of first links 222a, 222b each having a proximal end connected to a base member 228 via a rotary connection. The distal ends of the first pair of first links 222a, 222b connect to a gear module 270 via first and second rotary couplings 226a, 226b, respectively. The first and second rotary couplings 226a, 226b each attach to proximal ends of a second pair of second links 224a, 224b, via a pair of adjustable joint 250a, 250b, respectively. As illustrated, the adjustable joints 250a, 250b connect to the proximal ends of a second pair of second links 224a, 224b. As is further discussed herein, each adjustable joint 250a or 250b permits adjusting the pitch and/or roll of the second link 224a or 224b connected to the adjustable joint. Distal ends of the second pair of links 224a, 224b connect to a third link 240 via a pair of rotary bearings 242a, 242b. As illustrated, the second links 224a, 224b attach to a first and second spaced locations along a length of a proximal portion of the third link 240. A distal end of the third link 240 supports an end effector 232. As above, the end effector may be a Bernoulli wand. However, this is not a requirement. The substrate handler 220 may further include various gas lines 260 that extend from the base 228 to the end effector 232. Such gas lines may be external to the links. Alternatively, the gas lines may extend through the interior of one or more of the links as well as pass through the center of one or more of the rotary connections. Such gas lines may provide airflow to control substrate pickup and release. For instance, the gas lines may provide airflow through the end effector 232 when utilizing a Bernoulli's wand. Further such gas lines 260 may provide vacuum to the end effector as well as purge gases.

The links are driven by an axle 230 connected to the proximal end of one of the first links. That is, one of the first links is a drive bar 222a that is connected to the base member 228 via the axle 230. The axle 230 is fixedly connected to a proximal end of the drive bar 222a and extends through the base member 228 where it may be rotated by an actuator (e.g., motor; not shown). Such rotation imparts movement to the substrate handler. The other link 222b attaches to the base member 228 by a rotary bearing 234. When the axle 230 rotates the adjustor bar 222a, a distal end of the drive bar 222a imparts a movement on the gear module 270 via the first rotary coupling 226a. In the illustrated embodiment, lower ends of the first and second rotary couplings 226a, 226b connect to the distal ends of the links 222a, 222b. As best shown in the partial cross-sectional view of FIG. 4B, the first and second rotary coupling 226a, 226b further include a pair of meshed gears 236a, 236b. In this arrangement, movement imparted by the drive bar 222a, which may be fixedly attached to a shaft of the first rotary coupling 226a, results a rotation on the gears about their central axes. One of the gears 236b has a counter-rotating center such that rotation of the upper ends (output end) of the rotary couplings 226a, 226b is in a common direction (e.g., clockwise or counterclockwise). As illustrated in FIG. 4A, the upper ends of the first and second rotary couplings 226a, 226b connect with the first and second adjustable joints 250a, 250, respectively. Accordingly, when the axle 230 rotates the drive bar 222a, the first pair of links 222a, 222b rotate in unison and impart a common rotation to the first and second rotary couplings 226a, 226b. These rotatory joints 226a, 226b rotate in unison turning the second pair of second links 224a, 224b via the adjustable joints 250a, 250b. The second links 224a, 224b impart a rotation of the third link 240 about a vertical axis (not shown) disposed between the pair of rotary bearings 242a, 242b attaching the distal ends of the second links 224a, 224b to the third link 240. Likewise, the end effector 232, which is fixedly connected to the third link 240, rotates about the vertical axis between the rotary bearings 242a, 242b. In operation, the substrate handler 220 is configured to move the end effector 232 between predetermined pickup and release positions.

As with the embodiment discussed in relation to FIGS. 2A-3B, the substrate handler is susceptible to unwanted deflection due to, for example, high temperature drooping and/or mechanical misalignment. To allow for adjusting the pickup surface of the end effector 232 with a desired pickup or release plane, the substrate handler utilizes adjustable joints 250a, 250b that connect the second links 224a, 224b to the first links 222a, 222b via the rotary couplings 226a, 226b.

Figure 5:
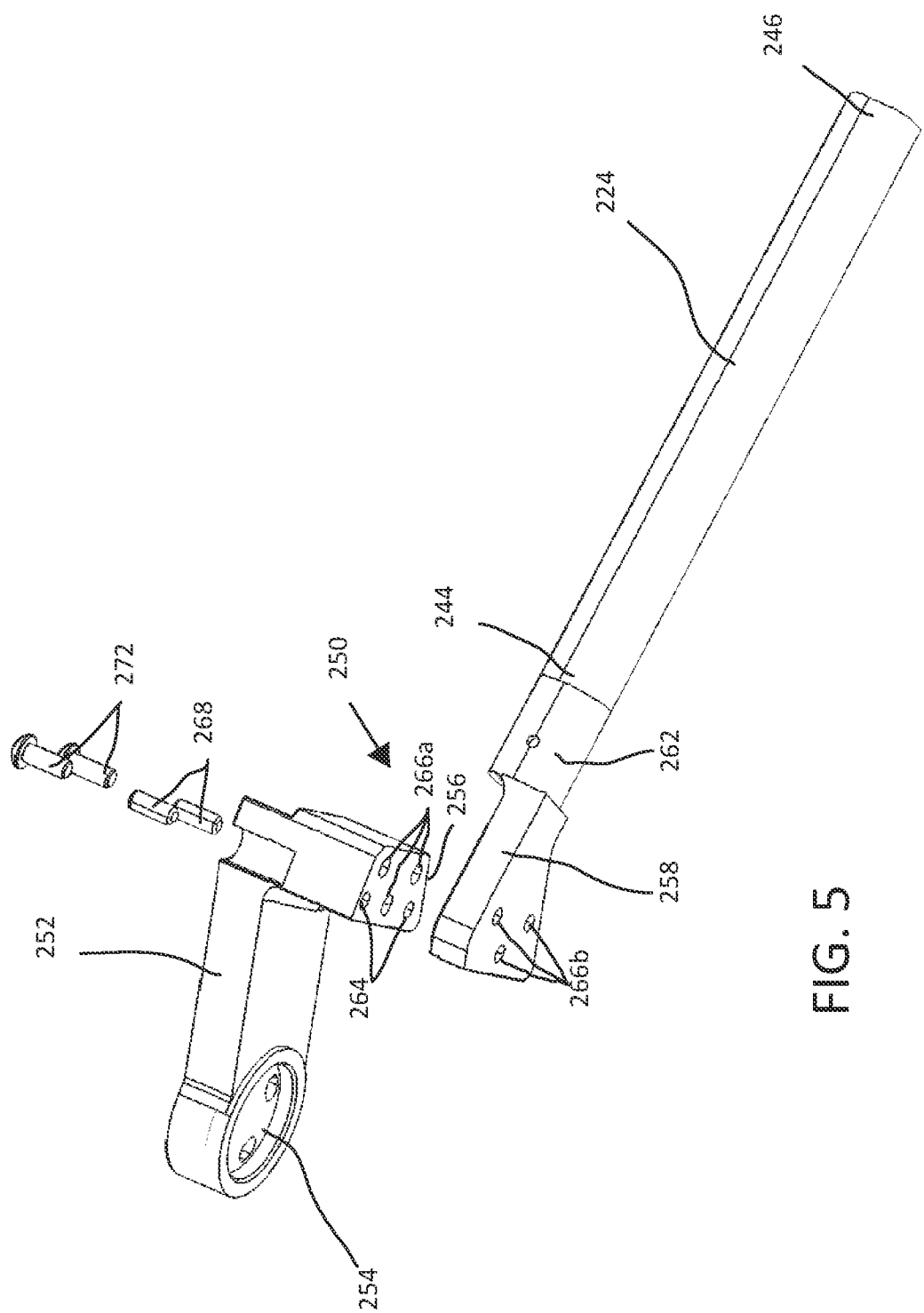
FIG. 5 illustrates one exemplary embodiment of an adjustable joint in accordance with the disclosure.

FIG. 5 illustrates an exploded perspective view of one of the adjustable joints 250a or 250b (hereafter 250) and one of the corresponding second links 224a or 224b (hereafter 224). The illustrated adjustable joint 250 includes two primary components that collectively permit the joint to adjust the pitch and/or roll of a distal end 246 of the link 244. Specifically, the joint 250 includes a first body that is connectable to the rotary coupling and a second body that is connectable to the link. The first and second bodies are configured to be rigidly connected to one another along mating surfaces. The interface between these mating surfaces may be adjusted to adjust a contact angle there between, preferably in at least two axes. Through such adjustment, the pitch and/or roll of the attached link may be adjusted. The first body or tilt plate 252 has an adjustment surface 256 that is configured to engage a generally planar contact surface 257 (e.g., top surface) of the second body or base plate 258. The tilt plate 252 of the joint 250 has a first end 254 configured to attach to one of the rotary couplings. In the illustrated embodiment this first end 254 comprises a circular recess having one or more fastener apertures allowing the tilt plate 252 to be fixedly attached to an upper end (e.g. shaft) of a rotary coupling. The second end of the tilt plate 252 includes the adjustment surface 256. In the illustrated embodiment, the tilt plate 252 is generally L-shaped between its first and second ends. However, it will be appreciated that the shape may be varied based on a desired application and/or configuration of a substrate handler. The base plate 258 attaches to a proximal end of the link 224 via a connector 262.

The adjustment surface 256 of the tilt plate 252 and the contact surface 257 of the base plate 258 each include a plurality of apertures. More specifically, a first set fastener apertures 266a extend through the adjustment surface 256 of the tilt plate 252. A matching set fastener apertures 266b extend through the contact surface of the base plate 252. More specifically, these fattener apertures extend through the tilt plate 262 and base plate 258. Fasteners, such as bolts 272 may extend through the matching sets of fastener apertures to rigidly affix the adjustment surface 256 of the tilt plate 252 to the contact surface 257 of the base plate 258. In addition to the fastener apertures, two adjustment apertures 264 extend through the adjustment surface 256 of the tilt plate 252. The adjustment apertures 264 are configured to receive two threaded set screws 268. The adjustment apertures 264 are internally threaded allowing advancement of the set screws 268 to a desired position relative to the adjustment surface 256. The base plate 258 is free of any mating adjustment apertures. Accordingly, tips of any set screws advanced through the adjustment apertures 264 beyond (e.g., above) the adjustment surface 256 of the tilt plate 252 engage the top surface of the base plate 258, when the tilt plate 252 and base plate 258 are connected. The disposition of the tip of the set screws 268 between the adjustment surface 256 and the contact surface 257 adjusts an angular interface (e.g., contact angle) there between.

Figure 6A:
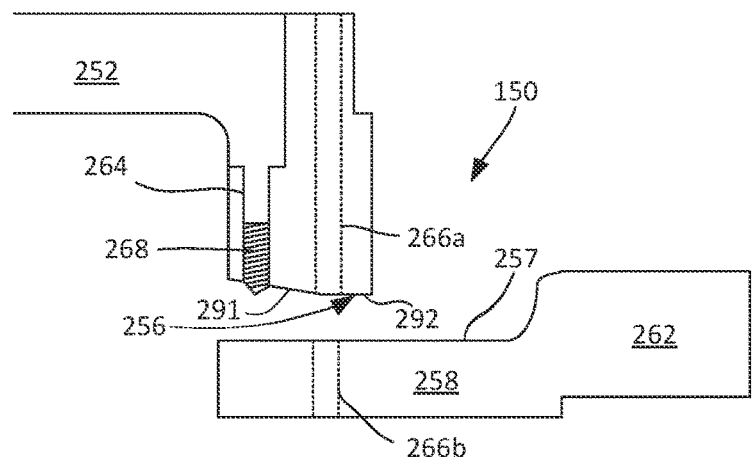
FIGS. 6A-6D illustrate a first series of adjustment of the adjustable joint of FIG. 5.
Figure 6B:
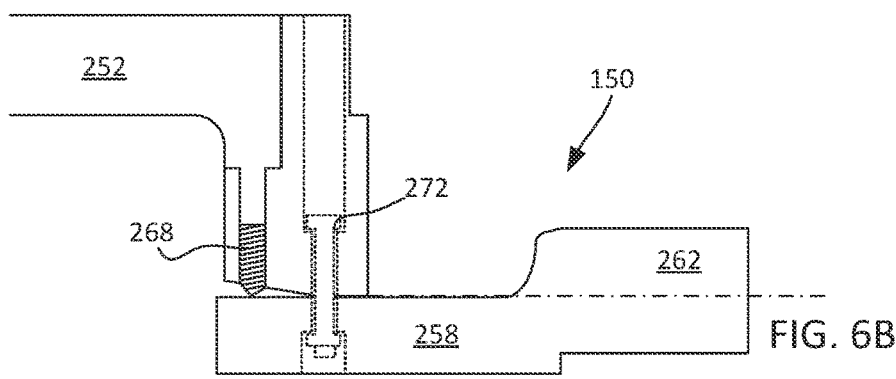
Figure 6C:
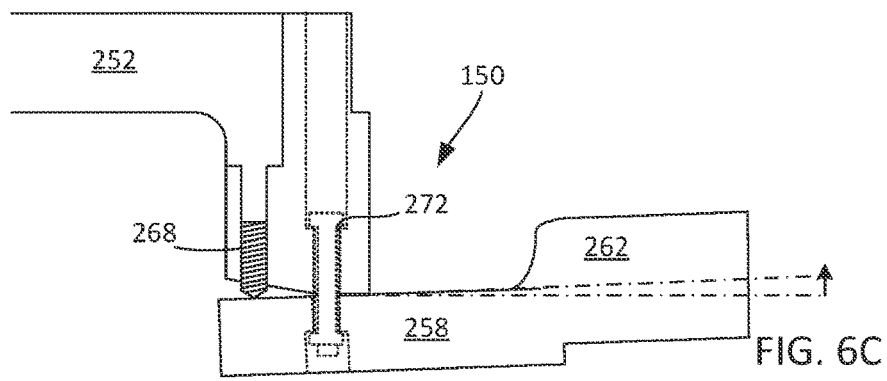
Figure 6D:
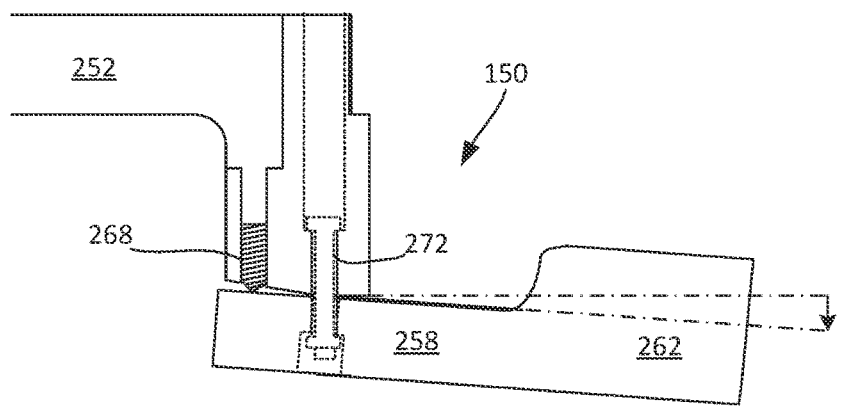

FIGS. 6A-6D each illustrate a partial cross-sectional view of the joint 250 taken through one of the adjustment apertures 264. As shown, the tilt plate 252 may initially be positioned above the base plate 258 to align the fastener apertures 266a, 266b. See FIG. 6A. The tilt plate 252 may then be advanced to contact the adjustment surface 256 against the contact surface 257 of the base plate 258. One or more threaded bolts 272 may extend through the aligned fastener apertures, engage a mating connector (e.g., threaded nut) and be tightened to rigidly affix the tilt plate 252 to the base plate 258. See FIG. 6B. Once rigidly affixed, the adjustable joint 250 is fixed and provides no further movement during use of the substrate handler. In the illustrated embodiment, the set screw(s) 268 are advanced beyond (e.g., above) the surface of the adjustment surface 256 to align the base plate 258 in a neutral position such that a contact angle between at least a portion of the adjustment surface and the contact surface is essentially zero. This is illustrated by the dashed reference line in FIG. 6B. In such an arrangement, the connector 262 attached to the base plate 258 and any link attached to the connector 262 may be held in a neutral pitch position (e.g., level) once the bolts 272 are tightened. If adjustment is desired, the set screws 268 may be further advanced or retracted prior to tightening the bolts 272. Advancing the set screws 268 beyond the neutral position, as illustrated in FIG. 6C, results in altering (e.g., increasing) the contact angle of connection between the adjustment surface 256 and the contact surface 257 as shown by the two dashed reference lines in FIG. 6C. This adjustment tilts the base plate 258, the connector 262 and any connected link upward, when the base plate 256 and tilt plate 252 are rigidly connected. This increases the pitch a distal end of a connected link. Retracting the set screws beneath the neutral position, as illustrated in FIG. 6D, results in altering (e.g., decreasing) the contact angle of connection between the adjustment surface 256 and the contact surface 257 as shown by the two dashed reference lines in FIG. 6D. This result in tilting the base plate, the connector 262 and any connected link downward thereby decreasing the pitch of a distal end of the connected link. In the illustrated embodiments of FIGS. 6B-6D, the adjustment of the set screws permits adjustment of the generally planar contact surface of the base plate along a first axis. Though the adjustment surface 256 of the tilt plate 252 is illustrated has having two angled planar surfaces (e.g., first planar surface 291 and second planar surface 292) allowing for increasing and decreasing the pitch of an attached link, it will be appreciated that the adjustment surface may be formed of a single planar surface. In such an arrangement, the adjustable joint may be limited to, for example, increasing the pitch of an attached link by advancing the set screws beyond the single planar adjustment surface (e.g., to address drooping).

Figure 7A:
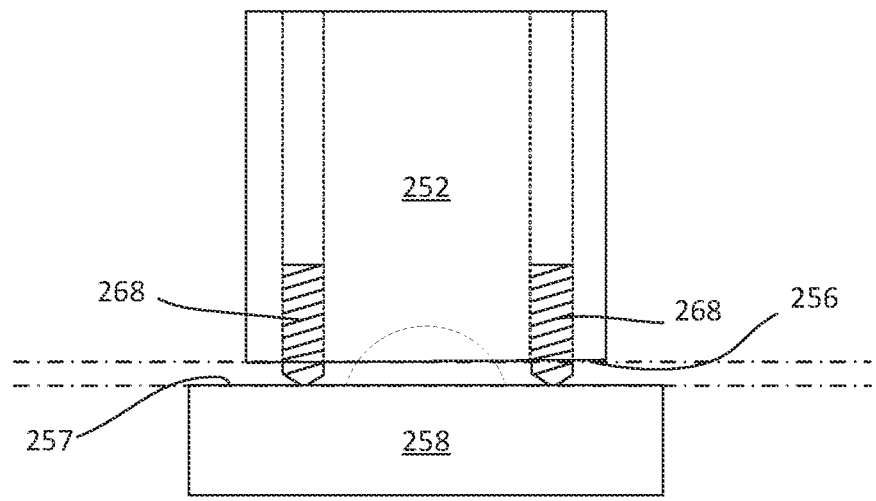
FIGS. 7A and 7B illustrate a second series of adjustments of the adjustable joint of FIG. 5.
Figure 7B:
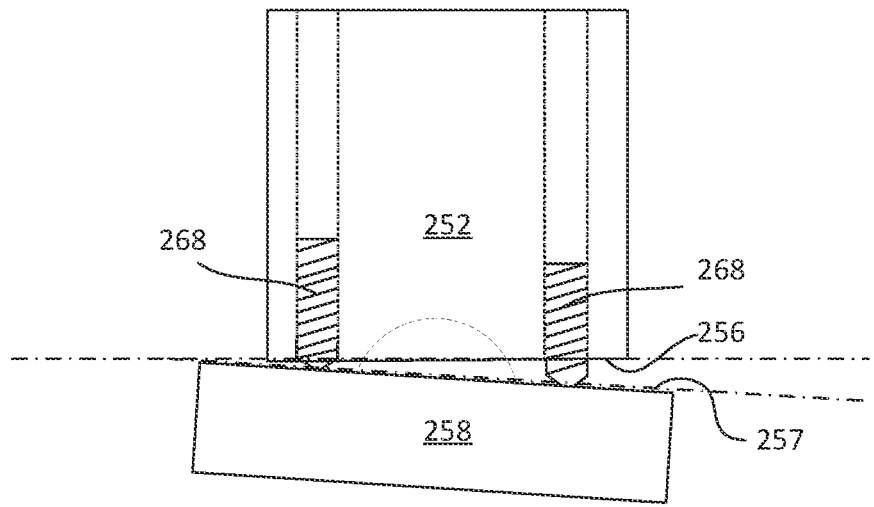

In addition to increasing or decreasing the pitch of an attached link along a long axis between its proximal and distal ends, the joint 250 may also adjust the roll of an attached link around its long axis. This is illustrated in FIGS. 7A and 7B, which illustrate partial cross-sectional views taken through the two adjustment apertures 264. As illustrated in FIG. 7A, when the two set screws 268 are equally advanced through the adjustment surface 256 of the tilt plate 252, the base plate 258 may be substantially level (e.g., neutral) as illustrated by the reference lines aligned with the contact surface 257 of the base plate 258 and the adjustment surface 256 of the tilt plate 252. If roll about the long axis of the attached link is desired, the set screws 268 may be advanced through the adjustment surface 256 of the tilt plate 252 by differing amounts. This results in tilting the base plate once affixed secured to the tilt plate 252. The tilting of the base plate rotates the connector and any connected link. In the illustrated embodiments of FIGS. 7A and 7B, the adjustment of the set screws permits adjustment of the generally planer contact surface of the base plate along a second axis that is substantially transverse to the first axis adjustment illustrated in FIGS. 6B-6D. It will be further appreciated that the two set screws may be adjusted to obtain a desired tilting of an end effector pickup surface. In the embodiment of FIG. 4A, the first and second adjustable joints may be individually adjusted to provide desired positioning of the end effector pickup surface.

Figure 4B:
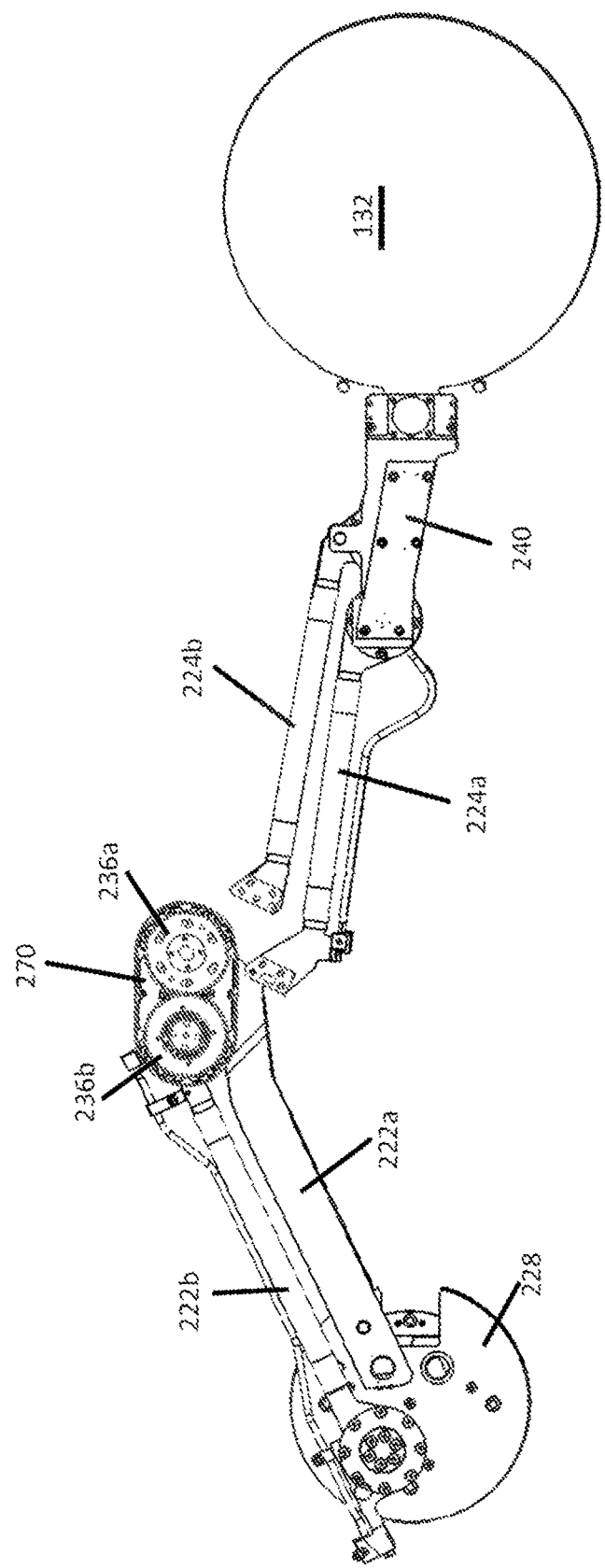
FIG. 4B illustrates a partial cross-sectional view of the substrate handler of FIG. 4A.

In addition to the ability to adjust the pickup surface of an end effector, the presented substrate handler provides another significant benefit. Namely, the presented links-type substrate handler removes any gearing from the end effector side of the links. That is, meshing of mating gears can generate particulates during movement can generate particles, which can contaminate substrates during processing. To reduce or eliminate such a potential source of contamination, any movable (e.g., rotary) connections near the end effector are free of any mating gears. As illustrated in FIGS. 4A and 4B, the substrate handler is configured to utilize a single set of gears 236*a*, 236*b* in the rotary couplings 226*a*, 226*b* that connect the first set of links 222*a*, 222*b* to the second set of links 224*a*, 224*b*, via the adjustable joints. In the presented embodiment, the only connection of the second links 224*a*, 224*b* to the third link 240 (i.e., near the end effector) is by two rotary bearings 242*a*, 242*b*. These rotary bearings 242*a*, 242*b* permit rotational movement between the distal ends of the second links 224*a*, 224*b* and the third link 240. In one embodiment, these rotary bearings include an inner ring and an outer ring which contain silicon nitride ceramic balls there between. The ceramic balls have four points of contact on the rings to allow perfect rotation without any deformation and dislocation of the shaft. This rotary bearing structure achieves better performance relating to particle issues as the ceramic balls will not result in any metal contamination. In summary, there are no gears or other similar devices that may be a source of particulate contamination near the end effector 232. In an embodiment, there are no gear type components within at least 100 mm of the end effector 232. In a further embodiment, there are no gear type components within at least 200 mm of the end effector. Stated otherwise, there may be no gear type components within a distance of the end effector that is at least one-half of a maximum cross-dimension of the end effector. In another embodiment, there may be not gear type components within a distance that that is at least equal to a maximum cross dimension of the end effector.

Although exemplary embodiments of the present disclosure are set forth herein, it should be appreciated that the disclosure is not so limited. For example, substrate handler devices having one or more adjustable joints are described in connection with various specific configurations, the disclosure is not necessarily limited to these examples. Various modifications, variations, and enhancements of the system and method set forth herein may be made without departing from the spirit and scope of the present disclosure.

The subject matter of the present disclosure includes all novel and nonobvious combinations and subcombinations of the various systems, components, and configurations, and other features, functions, acts, and/or properties disclosed herein, as well as any and all equivalents thereof.

We claim:
1. A substrate handling device, comprising:
   a first link comprising and extending between a proximal end and a distal end;
   a second link comprising and extending between a proximal end and a distal end;
   a rotary coupling coupled between the distal end of the first link and to the proximal end of the second link; and
   an adjustable joint disposed between the rotary coupling and the proximal end of the second link, the adjustable joint configured to adjust a pitch or roll of at least a portion of the second link, wherein the adjustable joint comprises:
- a first body connected to the rotary joint; and
- a second body connected to the proximal end of the second link, wherein the first body and the second body are rigidly connectable at a selected contact angle to adjust the pitch or roll of at least the portion of the second link,
- wherein the first body comprises an adjustment surface and the second body comprises a contact surface, wherein the adjustment surface is disposed against the contact surface when the first body and the second body are rigidly connected, and wherein the adjustment surface comprises first and second surfaces that are abutting, with the first surface being angled away from the second surface.

2. The device of claim 1, wherein the first link comprises a generally parallel pair of first links.

3. The device of claim 2, where the second link comprises a generally parallel pair of second links.

4. The device of claim 3, wherein the rotary coupling comprises first and second rotary couplings that translate movement of the pair of first links to the pair of second links.

5. The device of claim 1, wherein the rotary coupling comprises at least a first gear for translating motion from the first link to the second link.

6. The device of claim 5, further comprising an end effector coupled to the distal end of the second link, wherein the end effector is spaced at least 200 mm from the first gear.

7. The device of claim 1, wherein the first body comprises an adjustment aperture and a set screw disposed in the adjustment aperture.

8. The device of claim 7, wherein the set screw is configured for advancement and retraction to dispose a tip of the set screw in a position contacting the second body to achieve a desired pitch or roll of at least the portion of the second link.

9. The device of claim 1, further comprising a third link between the distal end of the second link and the end effector.

10. The device of claim 9, wherein the third link is coupled to the second link by at least one rotary bearing permitting rotational movement between the distal end of the second link and the third link.

11. The device of claim 10, wherein the at least one rotary bearing comprises an inner ring, an outer ring, and ceramic balls therebetween to allow the rotational movement.

* * * * *